(12) United States Patent
Arbabi et al.

(10) Patent No.: US 11,469,265 B2
(45) Date of Patent: *Oct. 11, 2022

(54) IMAGING APPARATUS AND IMAGE SENSOR INCLUDING THE SAME

(71) Applicants: SAMSUNG ELECTRONICS CO., LTD., Suwon-si (KR); CALIFORNIA INSTITUTE OF TECHNOLOGY, Pasadena, CA (US)

(72) Inventors: Amir Arbabi, Pasadena, CA (US); Seunghoon Han, Suwon-si (KR); Andrei Faraon, Pasadena, CA (US)

(73) Assignees: SAMSUNG ELECTRONICS CO., LTD., Suwon-si (KR); CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/335,705

(22) Filed: Jun. 1, 2021

(65) Prior Publication Data

US 2021/0288096 A1    Sep. 16, 2021

Related U.S. Application Data

(63) Continuation-in-part of application No. 16/527,341, filed on Jul. 31, 2019, now Pat. No. 11,037,976,
(Continued)

(30) Foreign Application Priority Data

Apr. 11, 2016    (KR) .................. 10-2016-0044268

(51) Int. Cl.
*H01L 27/146*    (2006.01)
*H04N 5/225*    (2006.01)
*G03B 35/10*    (2021.01)

(52) U.S. Cl.
CPC .. *H01L 27/14627* (2013.01); *H01L 27/14605* (2013.01); *H01L 27/14621* (2013.01); *G03B 35/10* (2013.01); *H04N 5/2257* (2013.01)

(58) Field of Classification Search
CPC ......... H01L 27/14627; H01L 27/14625; H01L 27/14605; H01L 27/14621; H04N 5/2257;
(Continued)

(56) References Cited

U.S. PATENT DOCUMENTS 5,760,834 A    6/1998    Rostoker
8,169,879 B2    5/2012    Kamiguchi et al.
(Continued)

FOREIGN PATENT DOCUMENTS

JP    2011-99715 A    5/2011
KP    10-2016-0120653 A1    10/2016
(Continued)

OTHER PUBLICATIONS

Arbabi et al., "Subwavelength-thick lenses with high numerical apertures and large efficiency based on high-contrast transmitarrays", May 7, 2015, 6 pages total, Nature Communications.
(Continued)

*Primary Examiner* — John R Lee
(74) *Attorney, Agent, or Firm* — Sughrue Mion, PLLC

(57) ABSTRACT

An image sensor includes a substrate, thin lenses disposed on a first surface of the substrate and configured to concentrate lights incident on the first surface, and light-sensing cells disposed on a second surface of the substrate, the second surface facing the first surface, and the light-sensing cells being configured to sense lights passing through the thin lenses, and generate electrical signals based on the sensed lights. A first thin lens and second thin lens of the thin lenses are configured to concentrate a first light and a second light, respectively, of the incident lights onto the light-
(Continued)

sensing cells, the first light having a different wavelength than the second light.

21 Claims, 18 Drawing Sheets

Related U.S. Application Data which is a continuation of application No. 15/221,719, filed on Jul. 28, 2016, now Pat. No. 10,403,668.

(60) Provisional application No. 62/198,268, filed on Jul. 29, 2015.

(58) Field of Classification Search
CPC .. H04N 5/2254; H04N 13/207; H04N 13/204; H04N 13/214; H04N 13/218; H04N 13/229; G03B 35/10; G03B 35/00
See application file for complete search history.

(56) References Cited

U.S. PATENT DOCUMENTS

| | | | |
|---|---|---|---|
| 9,060,120 | B2 | 6/2015 | Venkataraman et al. |
| 9,946,051 | B2 | 4/2018 | Han et al. |
| 9,995,930 | B2 | 6/2018 | Arabi et al. |
| 10,403,668 | B2 * | 9/2019 | Arbabi ............... H01L 27/14621 |
| 10,790,325 | B2 * | 9/2020 | Arbabi ................ H04N 5/2254 |
| 11,037,976 | B2 * | 6/2021 | Arbabi ............... H01L 27/14605 |
| 11,089,286 | B2 * | 8/2021 | Arbabi ................... G02B 5/188 |
| 11,211,418 | B2 * | 12/2021 | Arbabi ............... H01L 27/14627 |
| 2008/0117519 | A1 | 5/2008 | Chari et al. |
| 2009/0097381 | A1 | 4/2009 | Hamano et al. |
| 2009/0122178 | A1 | 5/2009 | Kwon et al. |
| 2009/0219432 | A1 | 9/2009 | Palum et al. |
| 2011/0122308 | A1 | 5/2011 | Duparre |
| 2011/0228142 | A1 | 9/2011 | Brueckner et al. |
| 2012/0091551 | A1 | 4/2012 | Marenco |
| 2012/0328240 | A1 | 12/2012 | Ma et al. |
| 2013/0002253 | A1 | 1/2013 | Werner et al. |
| 2013/0044187 | A1 | 2/2013 | Hammes et al. |
| 2013/0293760 | A1 | 11/2013 | Nisenzon et al. |
| 2013/0308197 | A1 | 11/2013 | Duparre |
| 2013/0321581 | A1 | 12/2013 | El-Ghoroury et al. |
| 2014/0267243 | A1 | 9/2014 | Venkataraman et al. |
| 2014/0267890 | A1 | 9/2014 | Lelescu et al. |
| 2014/0277433 | A1 | 9/2014 | Pugh et al. |
| 2014/0307059 | A1 | 10/2014 | Haddad et al. |
| 2014/0333764 | A1 | 11/2014 | Venkataraman et al. |
| 2014/0263982 | A1 | 12/2014 | Shkunov et al. |
| 2014/0354855 | A1 | 12/2014 | Venkataraman et al. |
| 2015/0061066 | A1 | 3/2015 | Murayama |
| 2015/0123230 | A1 | 5/2015 | Jin et al. |
| 2015/0130973 | A1 | 5/2015 | Saito et al. |
| 2015/0373261 | A1 | 12/2015 | Rodda et al. |
| 2016/0198143 | A1 | 7/2016 | Ishiga |
| 2016/0299337 | A1 | 10/2016 | Arbabi et al. |
| 2017/0034500 | A1 | 2/2017 | Arbabi et al. |
| 2018/0020209 | A1 | 1/2018 | Ko et al. |
| 2018/0084238 | A1 | 3/2018 | Chossat et al. |
| 2019/0355772 | A1 * | 11/2019 | Arbabi ............... H01L 27/14627 |
| 2020/0052027 | A1 * | 2/2020 | Arbabi ............... H01L 27/14621 |
| 2020/0292809 | A1 * | 9/2020 | Arbabi ............... G02B 27/4272 |
| 2020/0388644 | A1 * | 12/2020 | Arbabi ............... H01L 27/14621 |
| 2021/0288096 | A1 * | 9/2021 | Arbabi ............... G02B 27/0075 |

FOREIGN PATENT DOCUMENTS

| | | |
|---|---|---|
| KR | 10-2015-0052695 A | 5/2015 |
| KR | 10-2016-0125875 A | 11/2016 |

OTHER PUBLICATIONS

Communication dated May 27, 2022 by the Korean Intellectual Property Office in counterpart Korean Patent Application No. 10-2016-0044268.

* cited by examiner

IMAGING APPARATUS AND IMAGE SENSOR INCLUDING THE SAME

CROSS-REFERENCE TO RELATED APPLICATIONS

This application is a continuation-in-part of U.S. application Ser. No. 16/527,341, filed Jul. 31, 2019, which is a continuation of U.S. application Ser. No. 15/221,719, filed Jul. 28, 2016, which claims priority from U.S. Provisional Patent Application No. 62/198,268, filed on Jul. 29, 2015, and Korean Patent Application No. 10-2016-0044268, filed on Apr. 11, 2016, in the Korean Intellectual Property Office, the disclosures of which are incorporated herein by reference in their respective entireties.

STATEMENT REGARDING FEDERALLY SPONSORED RESEARCH OR DEVELOPMENT

This invention was made with government support under Grant No. W911NF-14-1-0345 awarded by the U.S. Army. The government has certain rights in the invention.

BACKGROUND

1. Field

Apparatuses and methods consistent with exemplary embodiments relate to image sensors.

2. Description of the Related Art

Optical sensors including semiconductor sensor arrays may be used in mobile devices, wearable devices, and the Internet of Things. Although such devices should be small, it is difficult to reduce the thicknesses of imaging apparatuses included in these devices.

Also, as demand for a 3-dimensional image sensor to be used in the Internet of Things, game devices, and other mobiles has increased, an optical system capable of controlling pathways of light incident onto the 3-dimensional image sensor is needed. However, because a conventional 3-dimensional image sensor includes complicated optical lenses, it has been difficult to manufacture an appropriate 3-dimensional image sensor for use in such devices.

SUMMARY

Exemplary embodiments may address at least the above problems and/or disadvantages and other disadvantages not described above. Also, the exemplary embodiments are not required to overcome the disadvantages described above, and may not overcome any of the problems described above.

Provided are image sensors that may be configured to have a small size and may be configured to obtain 3-dimensional information about an object.

According to an aspect of an exemplary embodiment, an image sensor includes an image sensor includes a substrate, thin lenses disposed on a first surface of the substrate and configured to concentrate lights incident on the first surface, and light-sensing cells disposed on a second surface of the substrate, the second surface facing the first surface, and the light-sensing cells being configured to sense lights passing through the thin lenses, and generate electrical signals based on the sensed lights. A first thin lens and second thin lens of the thin lenses are configured to concentrate a first light and a second light, respectively, of the incident lights onto the light-sensing cells, the first light having a different wavelength than the second light.

The substrate may include sub-substrates, and the thin lenses and the light-sensing cells may be respectively disposed on a first surface and a second surface of each of the sub-substrates.

Each of the thin lenses may include scatterers, and each of the scatterers may have a pillar structure.

An interval distance between a pair of the scatterers may be less than a respective wavelength of light concentrated by a respective one among the thin lenses.

A height of the scatterers may be less than a respective wavelength of light concentrated by a respective one among the thin lenses.

The scatterers may include at least one from among silicon, gallium phosphide, SiC, SiN, and $TiO_2$.

Shapes of the scatterers and interval distances between respective pairs of the scatterers may vary with a respective wavelength of light concentrated by a respective one among the thin lenses.

The image sensor may further include light filters, each of the light filters being configured to filter a respective wavelength of light incident on a respective one among the light-sensing cells.

The image sensor may further include an image synthesizer configured to generate a multi-color image by synthesizing images of different colors, and at least two among the light-sensing cells may produce the images of different colors.

The image sensor may further include an image synthesizer configured to generate a stereo image based on images that are produced by the light-sensing cells.

The image synthesizer may be further configured to extract depth information about an object appearing in the stereo image.

According to an aspect of an exemplary embodiment, an image sensor includes a substrate, thin lenses disposed on a first surface of the substrate and configured to concentrate lights incident on the first surface, and light-sensing cells disposed on a second surface of the substrate, the second surface facing the first surface, and the light-sensing cells being configured to sense lights passing through the thin lenses, and generate electrical signals based on the sensed lights. A first thin lens and second thin lens of the thin lenses may be configured to concentrate a first light and a second light, respectively, of the incident lights to have different focal lengths.

The substrate may include sub-substrates, and the thin lenses and the light-sensing cells may be respectively disposed on a first surface and a second surface of each of the sub-substrates.

The concentrated lights may have predetermined wavelengths.

Each of the thin lenses may include scatterers, and each of the scatterers may have a pillar structure.

An interval distance between a pair of the scatterers may be less than a respective wavelength of light concentrated by a respective one among the thin lenses.

A height of the scatterers may be less than a respective wavelength of light concentrated by a respective one among the thin lenses.

Shapes of the scatterers and interval distances between respective pairs of the scatterers may vary with a respective wavelength of light concentrated by a respective one among the thin lenses.

The image sensor may further include a depth map calculator configured to calculate a defocusing degree of an image that is produced on each of the light-sensing cells, and calculate depth map information about an image that is produced by the incident lights, based on the defocusing degree.

The image sensor may further include a light filter layer configured to filter a wavelength of light incident on each of the light-sensing cells.

BRIEF DESCRIPTION OF THE DRAWINGS

The above and/or other aspects will be more apparent by describing exemplary embodiments with reference to the accompanying drawings.

DETAILED DESCRIPTION

Figure 1:
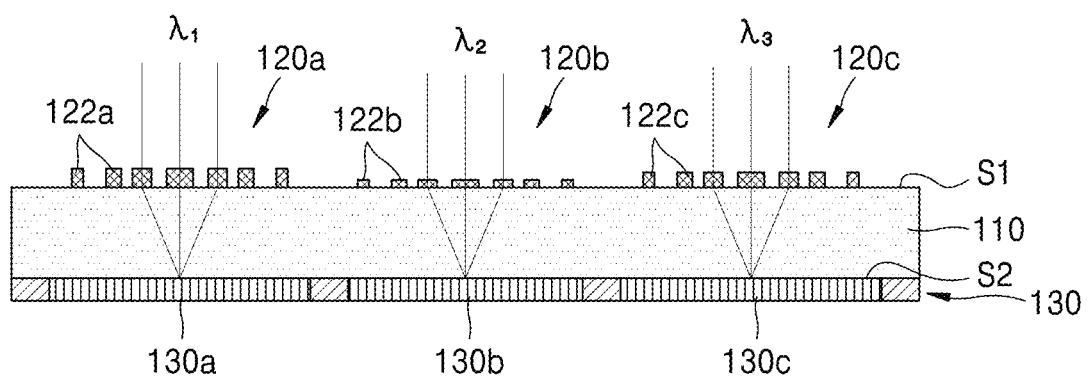
FIG. 1 is a cross-sectional view illustrating an image sensor according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions may not be described in detail because they would obscure the description with unnecessary detail.

As used herein, the term "and/or" includes any and all combinations of one or more of the associated listed items. Expressions such as "at least one of," when preceding a list of elements, modify the entire list of elements and do not modify the individual elements of the list.

In the drawings, the thicknesses of layers and regions are exaggerated for clarity. It will also be understood that when a layer is referred to as being "on" another layer or substrate, it can be directly on the other layer or substrate, or intervening layers may also be present.

The terms used in this specification are those general terms currently widely used in the art in consideration of functions in regard to the inventive concept, but the terms may vary according to the intention of those of ordinary skill in the art, precedents, or new technology in the art. Also, specified terms may be selected by the applicant, and in this case, the detailed meaning thereof will be described in the detailed description. Thus, the terms used in the specification may be understood not as simple names but based on the meaning of the terms and the overall description.

Throughout the specification, it will be understood that when a component is connected to another component, the component may be directly connected as well as electrically connected with another element therebetween.

It will be further understood that the terms "comprises" and/or "comprising" used herein specify the presence of stated features or components, but do not preclude the presence or addition of one or more other features or components. In addition, the terms such as "unit," "-er (-or)," and "module" described in the specification refer to an element for performing at least one function or operation, and may be implemented in hardware, software, or the combination of hardware and software.

Additionally, it will be understood that although the terms "first," "second," etc. may be used herein to describe various components, these components may not be limited by these terms. These components are only used to distinguish one component from another.

Descriptions of embodiments below may not be understood as limiting the scope of right, but those easily inferred by one of ordinary skill in the art may be understood as belonging to the scope or right of the exemplary embodiments. Hereinafter, embodiments will be described in detail by referring to the accompanying drawings for the purpose of describing examples only.

FIG. 1 is a cross-sectional view illustrating an image sensor according to an exemplary embodiment.

Referring to FIG. 1, the image sensor according to an exemplary embodiment may include a substrate 110, a plurality of thin lenses 120a, 120b, and 120c that are arranged on a first surface S1, and a plurality of light-sensing cells 130a, 130b, and 130c arranged on a second surface S1 facing the first surface S1 of the substrate 110. At least two from among the thin lenses 120a, 120b, and 120c may concentrate lights having different wavelength components on the light-sensing cells 130a, 130b, and 130c. That is, two or more of the thin lenses 120a, 120b, and 120c may have wavelength selectivity with respect to different wavelengths.

The substrate 110 may have a plate-like shape. The first surface S1 and the second surface S2 of the substrate 110 may be substantially horizontally parallel to each other. However, the first surface S1 and the second surface S2 may not be completely horizontally parallel to each other and may be obliquely parallel to each other. The substrate 110 and the light-sensing cells 130a, 130b, and 130c may be spaced apart from one another with an air layer therebetween. The substrate 110 may include a transparent material. As used herein, the term "transparent material" denotes a material having a high light transmittance. For example, the substrate 110 may include at least one from among $Si_3N_4$, $SiO_2$, and a polymer such as PMMA or PDMS. Once a path of incident light changes at the light-sensing cells 130a, 130b, and 130c, the incident light may pass through the substrate 110 and become incident on a light sensing layer 130.

Each of the light-sensing cells 130a, 130b, and 130c may include scatterers from among a plurality of scatterers 122a, 122b, and 122c. The term 'thin-lens' refers to an optical device that changes a path of light by a difference in phase delays caused by the scatterers 122a, 122b, and 122c included in the thin-lenses, unlike related art optical lens. Accordingly, a thickness of the thin-lens may be hardly limited compared to that of an optical lens, and the thin-lens may be configured to be thin. The scatterers 122a, 122b, and 122c on surfaces of the thin lenses 120a, 120b, and 120c may be configured to resonate light incident on each of the scatterers 122a, 122b, and 122c. The scatterers 122a, 122b, and 122c may be configured to appropriately delay a transmission phase of the light incident on each of the scatterers 122a, 122b, and 122c.

The scatterers 122a, 122b, and 122c may be arranged on the first surface S1 of the substrate 110 to form a desired wave front of light that transmits from the first surface S1 of the substrate 110. Also, the thin lenses 120a, 120b, and 120c may change a path of transmittant light with respect to incident light by modulating a wave front of light.

At least two from among the thin lenses 120a, 120b, and 120c may be configured to concentrate pieces of light having different wavelength components among the incident light on the light sensing layer 130. For example, a first thin-lens 120a may be configured to concentrate a piece of light having a first wavelength $\lambda_1$ among the incident light. Also, a second thin-lens 120b may be configured to concentrate a piece of light having a second wavelength $\lambda_2$ among the incident light. Also, a third thin-lens 120c may be configured to concentrate a piece of light having a third wavelength $\lambda_3$ among the incident light. However, these are provided as examples for illustrative purpose only, and embodiments are not limited thereto. For example, not all of the first to third thin lenses 120a, 120b, and 120c have to concentrate pieces of light having different wavelengths, and two from among the first, second, and third thin lenses 120a, 120b, and 120c may be configured to concentrate pieces of light having substantially the same wavelength.

Figure 2:
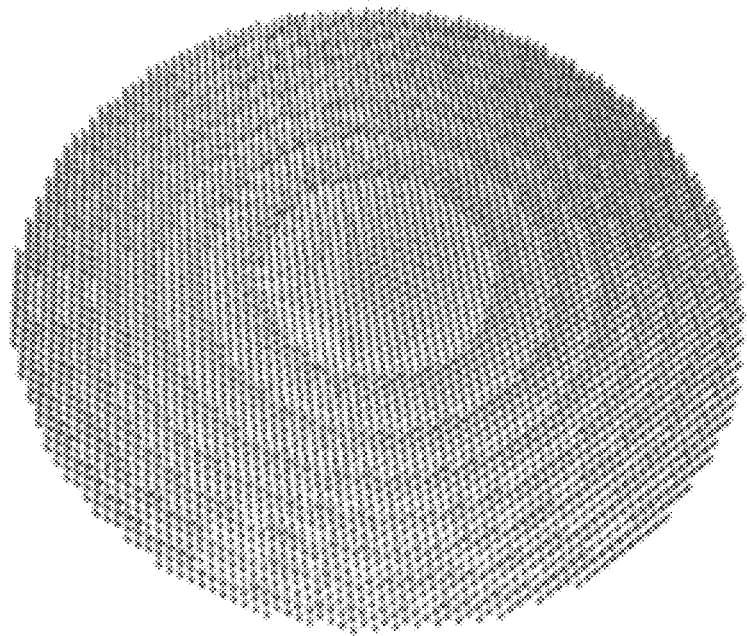
FIG. 2 is a view illustrating a surface of a thin lens according to an exemplary embodiment.

FIG. 2 is a view illustrating a surface of one from among the thin lenses 120a, 120b, and 120c according to an exemplary embodiment.

Referring to FIG. 2, a plurality of scatterers may be arranged on a surface of a thin-lens. A wave form of light transmitted from the thin-lens may depend on a shape, an interval distance, and a shape of arrangement of the scatterers. When the scatterers are formed on the surface of the thin-lens as shown in FIG. 2, light transmitted from the thin-lens may be concentrated. That is, the thin-lens shown in FIG. 2 maybe configured as a lens having positive refractive power.

FIGS. 3A, 3B, 3C, and 3D are perspective views illustrating various shapes of the scatterers 122a, 122b, and 122c according to exemplary embodiments.

Figure 3A:
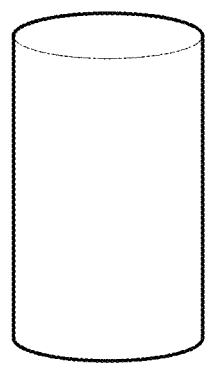
FIGS. 3A, 3B, 3C, and 3D are perspective views illustrating various shapes of scatterers according to exemplary embodiments.
Figure 3B:
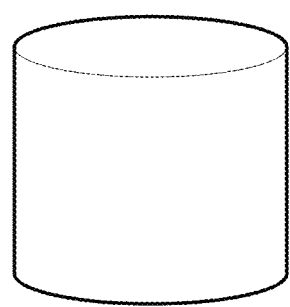
Figure 3C:
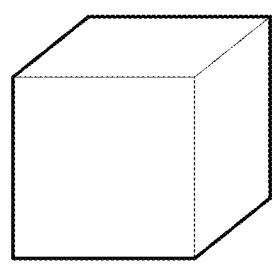
Figure 3D:
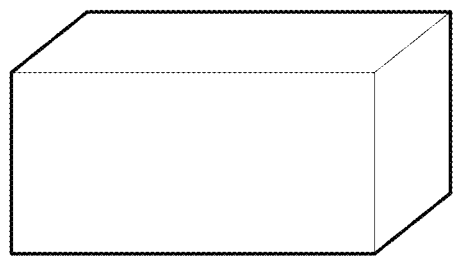

Referring to FIGS. 3A through 3D, the scatterers 122a, 122b, and 122c included in the thin lenses 120a, 120b, and 120c may have pillar structures. A shape of a cross-section of the pillar structure may be from among a circle, an oval, a rectangle, and a square. FIG. 3A illustrates a scatterer having a pillar structure with a cross-sectional shape of a circle. FIG. 3B illustrates a scatterer having a pillar structure with a cross-sectional shape of an oval. FIG. 3C illustrates a scatterer having a pillar structure with a cross-sectional shape of a square. FIG. 3D illustrates a scatterer having a pillar structure with a cross-sectional shape of a rectangle. The pillar structure may be appropriately tilted in a height direction.

FIGS. 3A through 3D show examples of shapes of the scatterers 122a, 122b, and 122c, but embodiments are not limited thereto. For example, at least one from among the scatterers 122a, 122b, and 122c may have a polygonal prism shape or a pillar structure with a cross-section having an "L"-like shape. At least one from among the scatterers 122a, 122b, and 122c may have a multi-layer structure formed of materials with different refractive indexes in a height direction. Also, shapes of the scatterers 122a, 122b, and 122c may not have symmetricity in a direction. For example, a cross-section of the scatterers 122a, 122b, and 122c may have shapes that are non-symmetrical in a horizontal direction such as, for example, an oval shape. Also, when cross-sections of the scatterers 122a, 122b, and 122c differ according to their height, the shapes of the scatterers 122a, 122b, and 122c may not have symmetricity with respect to the height.

The scatterers 122a, 122b, and 122c may have a shape according to wavelength selectivity of the thin lenses 120a, 120b, and 120c. Here, the term "wavelength selectivity" refers to each of the thin lenses 120a, 120b, and 120c selectively concentrating pieces of light of a predetermined wavelength band on the light sensing layer 130. For example, the scatterers 122a included in the first thin-lens 120a may have a shape appropriate to concentrate pieces of light of the first wavelength $\lambda_1$. In one embodiment, a cross-sectional shape of scatterers 122a and a ratio between a width and a height of the scatterers 122a may change. Also, scatterers 122b included in the second thin-lens 120b may have a shape appropriate to concentrate pieces of light of the second wavelength $\lambda_2$. Also, scatterers 122c included in the third thin-lens 120c may have a shape appropriate to concentrate pieces of light of the third wavelength $\lambda_3$. At least two from among the first, second, and third wavelengths $\lambda_1$, $\lambda_2$, and $\lambda_3$ may be different from each other.

Figure 4:
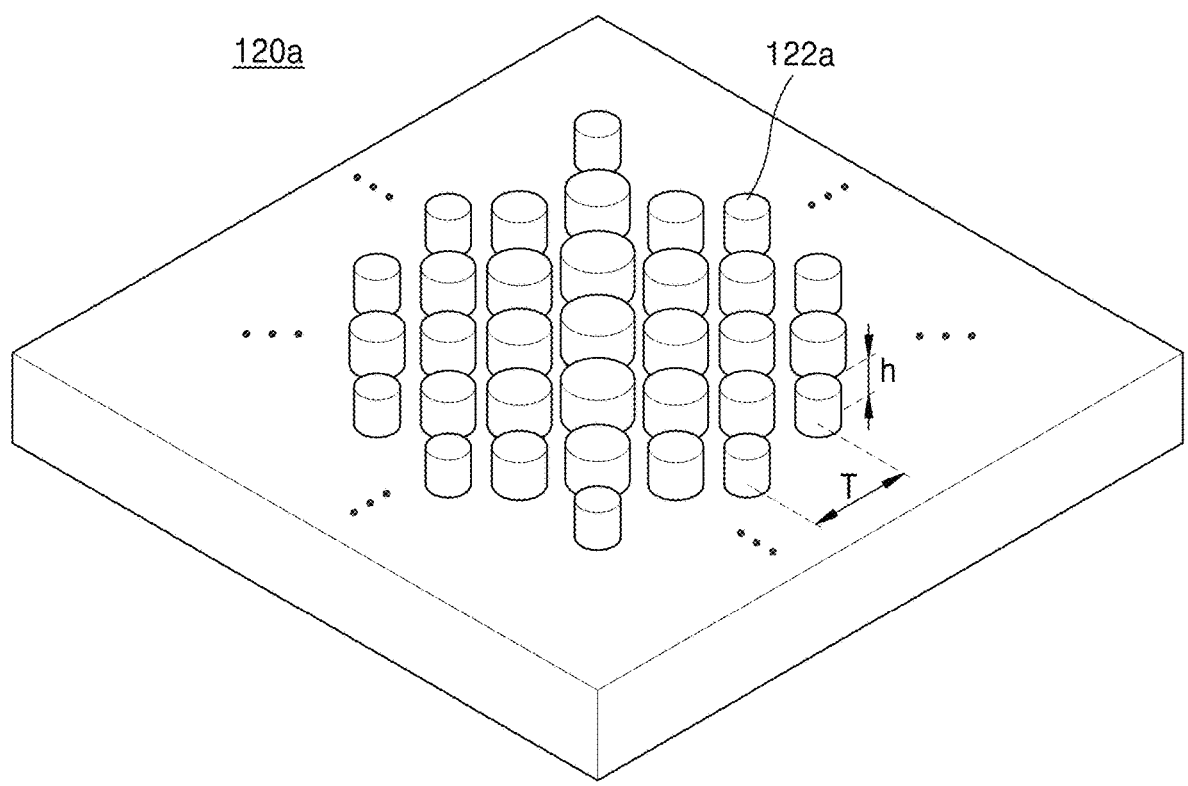
FIG. 4 is a view of a surface illustrating a first thin lens according to an exemplary embodiment.

FIG. 4 is a view illustrating a surface of the first thin-lens 120a according to an exemplary embodiment.

In FIG. 4, the first thin-lens 120a is used as an example, but the description with reference to FIG. 4 may be applied to the second and third thin lenses 120b and 120c.

Referring to FIG. 4, the scatterers 122a having pillar structures may be arranged on the substrate 110. In FIG. 4, the scatterers 122a have circular pillar structures as an example, but embodiments are not limited thereto. For example, the scatterers 122a may have any of various shapes such as polygonal prism shapes, circular cylindrical shapes, or elliptic cylindrical shapes. Alternatively, cross-sections of the scatterers 122a may have "L"-like prism shapes.

A refractive index of a material included in the scatterers 122a may be higher than a refractive index of a material included in the substrate 110. Thus, the substrate 110 may include a material having a relatively low refractive index, and the scatterers 122a may include a material having a relatively high refractive index. For example, the scatterers 122a may include at least one from among crystalline silicon (c-Si), polycrystalline silicon (poly Si), amorphous silicon (amorphous Si), $Si_3N_4$, GaP, $TiO_2$, AlSb, AlAs, AlGaAs, AlGaInP, BP, and $ZnGeP_2$. Also, for example, the substrate 110 may include one from among a polymer such as PMMA or PDMS, $Si_3N_4$, and $SiO_2$. An additional clad layer that surrounds and covers the scatterers 122a having a high refractive index on the substrate 110 with the material having a low refractive index may be formed.

The arrangement of the scatterers 122a may be determined according to a wavelength band of light that is concentrated by the first thin-lens 120a. For example, an interval distance T and an arrangement direction of the scatterers 122a included in the first thin-lens 120a may be determined in correspondence to the first wavelength $\lambda_1$ of light that is concentrated by the first thin-lens 120a. The interval distance T between the scatterers 122a of the first thin-lens 120a may be smaller than the first wavelength $\lambda_1$. In one embodiment, the interval distance T between the scatterers 122a of the first thin-lens 120a may be ¾ of the first wavelength $\lambda_1$ or less or ⅔ of the first wavelength $\lambda_1$ or less. Also, a height h of the scatterers 122a of the first thin-lens 120a may be smaller than the first wavelength $\lambda_1$. For example, the height h of the scatterers 122a of the first thin-lens 120a may be ⅔ of the first wavelength $\lambda_1$ or less.

Figure 5:
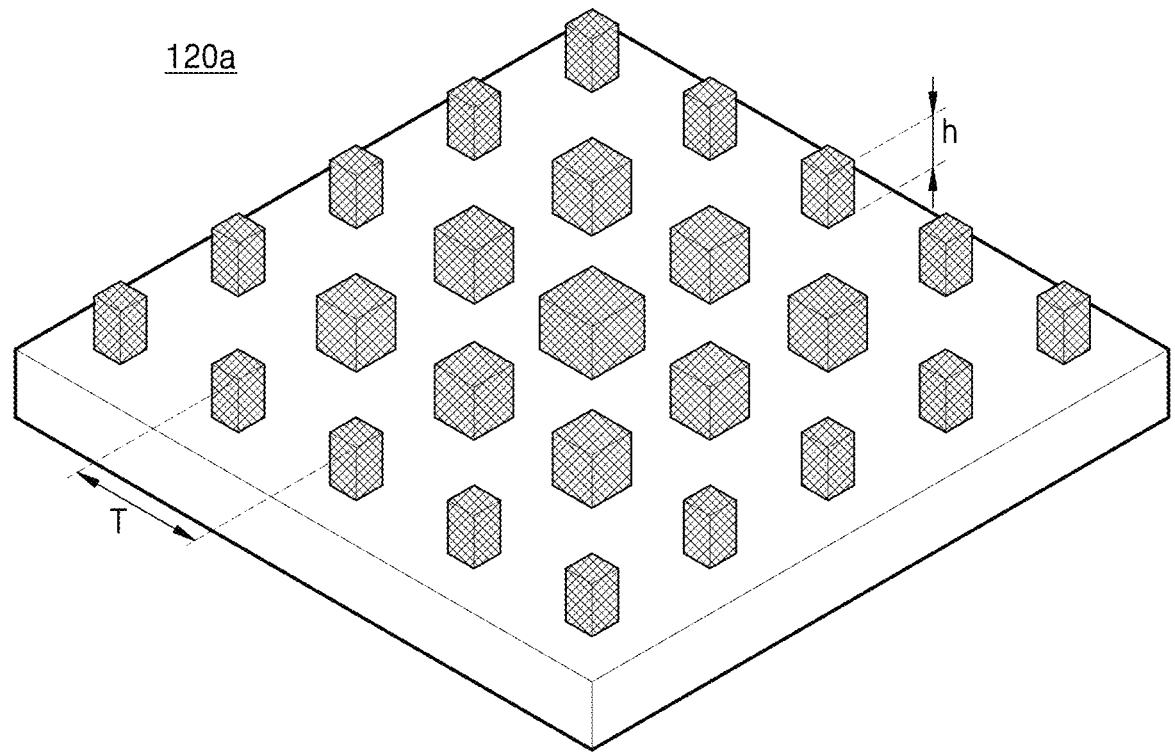
FIG. 5 is a view illustrating a surface of a first thin lens according to another exemplary embodiment.

FIG. 5 is a view illustrating a surface of the first thin lens 120a according to another exemplary embodiment.

Referring to FIG. 5, the scatterers 122a have rectangular parallelepiped shapes and may be arranged on the substrate 110. Although the scatterers 122a have rectangular parallelepiped shapes in FIG. 5, exemplary embodiments are not limited thereto. For example, the scatterers 122a may have any shape including polygonal prism shapes, circular cylindrical shapes, and elliptic cylindrical shapes. Alternatively, cross-sections of the scatterers 122a may have prism shapes. Also, heights and interval distances of the scatterers 122a may vary according to a wavelength selectivity of the first thin-lens 120a.

The description of shapes of the scatterers 122a made with reference to FIGS. 4 and 5 may apply to the scatterers 122b and 122c included in the second and third thin lenses 120b and 120c. However, shapes, interval distances, and arrangement directions of the scatterers 122b and 122c may vary according to a wavelength selectivity of each of the second and third thin lenses 120b and 120c. For example, interval distances and heights of the scatterers 122b included in the second thin-lens 120b may be determined according to the second wavelength $\lambda_2$. The interval distances and heights of the scatterers 122b included in the second thin-lens 120b may be smaller than the second wavelength $\lambda_2$. Also, interval distances and heights of the scatterers 122c included in the third thin-lens 120c may be determined according to the third wavelength $\lambda_3$. The interval distances and heights of the scatterers 122c included in the third thin-lens 120c may be smaller than the third wavelength $\lambda_3$.

Referring back to FIG. 1, the light-sensing cells 130a, 130b, and 130c may be configured to generate electrical signals upon sensing light that transmitted from at least one from among the thin lenses 120a, 120b, and 120c. The light-sensing cells 130a, 130b, and 130c may be formed in the light sensing layer 130. However, exemplary embodiments are not limited thereto, and the light-sensing cells 130a, 130b, and 130c may be separated from each other.

The light-sensing cells 130a, 130b, and 130c may be prepared in correspondence to the thin lenses 120a, 120b, and 120c. For example, a first light-sensing cell 130a may be configured to sense light that is transmitted from the first thin-lens 120a. Also, a second light-sensing cell 130b may be configured to sense light that is transmitted from the second thin-lens 120b. Also, a third light-sensing cell 130c may be configured to sense light that is transmitted from the third thin-lens 120c. The first, second, and third light-sensing cells 130a, 130b, and 130c may be configured to receive light and thus may output first, second, and third images, respectively.

Each of the light-sensing cells 130a, 130b, and 130c may include devices that convert light signals into electrical signals. For example, the light-sensing cells 130a, 130b, and 130c may include CCD sensors or CMOS sensors. Alternatively, the light-sensing cells 130a, 130b, and 130c may include photodiodes that convert light energy into electrical energy.

Because at least two from among the first, second, and third thin lenses 120a, 120b, and 120c have different wavelength selectivities, at least two of the first, second, and third light-sensing cells 130a, 130b, and 130c may be configured to measure images in different colors. Therefore, the first, second, and third images measured by the first, second, and third light-sensing cells 130a, 130b, and 130c, respectively, may be synthesized to obtain a multi-color image.

Figure 6:
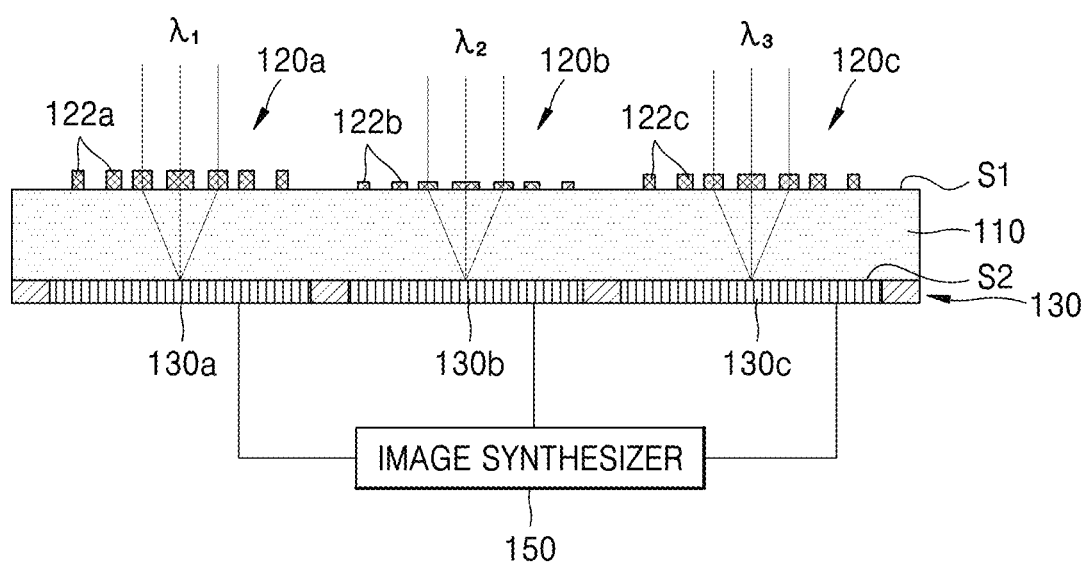
FIG. 6 is a view illustrating an image sensor according to an exemplary embodiment.

FIG. 6 is a view illustrating an image sensor according to an exemplary embodiment.

In FIG. 6, a repeated explanation of the same elements or operations as those in FIG. 1 will not be given.

Referring to FIG. 6, the image sensor according to an exemplary embodiment may include an image synthesizer 150 configured to synthesize images in different colors and thus produces a multi-color image. The image synthesizer 150 may synthesize the first, second, and third images obtained by the first, second, and third light-sensing cells 130a, 130b, and 130c. At least two among the first, second, and third images may be in different colors. Thus, the image synthesizer 150 may produce a multi-color image by synthesizing the first, second, and third images. The multi-color image may be an image in a plurality of colors. Also, when there are four or more light-sensing cells configured to perform an imaging process on four or more different wavelength bands, the multi-color image may be a hyperspectral image.

Because locations of the thin-lens 120a, 120b, and 120c are different from each other, light reflected by an object may be incident at different angles to the thin-lens 120a, 120b, and 120c. Thus, images of the object taken from different angles may be obtained from the first, second, and third light-sensing cells 130a, 130b, and 130c, respectively. The image synthesizer 150 may produce a stereo image from the images of the object taken from different angles. During a process of producing the stereo image, the image synthesizer 150 may extract parallax information among the first, second and third images. Also, the image synthesizer 150 may be configured to extract depth information of the object that is shown in the stereo image.

Figure 7:
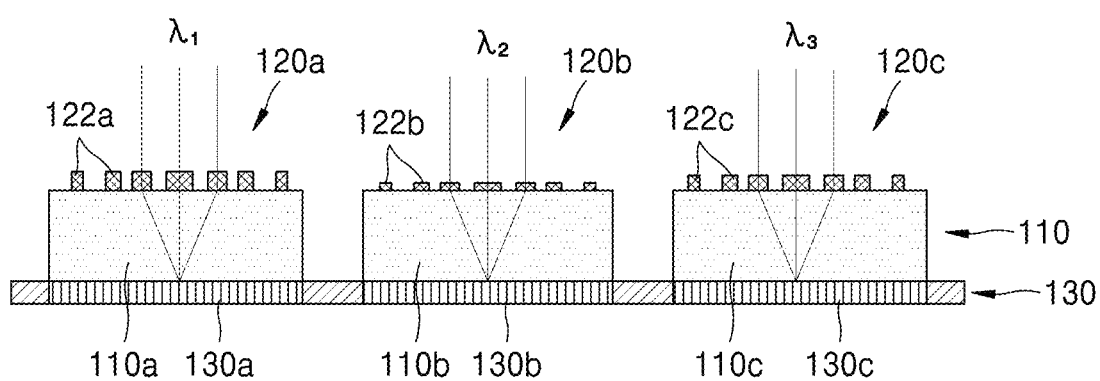
FIG. 7 is a view illustrating an image sensor according to an exemplary embodiment.

FIG. 7 is a view illustrating an image sensor according to an exemplary embodiment.

In FIG. 7, a repeated explanation of the same elements or operations as those in FIG. 1 will not be given.

Referring to FIG. 7, the substrate 110 may include a plurality of sub-substrates 110a, 110b, and 110c. The sub-substrates 110a, 110b, and 110c may be formed in correspondence to a respective thin lens of the plurality of thin lenses 120a, 120b, and 120c, and a respective light-sensing cell of the plurality of light-sensing cells 130a, 130b, and 130c. For example, the first thin-lens 120a and the first light-sensing cell 130a may be formed on a first and second surface of a first sub-substrate 110a, respectively. Also, the second thin-lens 120b and the second light-sensing cell 130b may be formed on a first and second surface of a second sub-substrate 110b, respectively. Also, the third thin-lens 120c and the third light-sensing cell 130c may be formed on a first and second surface of a third sub-substrate 110c, respectively. When the substrate 110 is divided into the sub-substrates 110a, 110b, and 110c, interference between pieces of light that are incident on each of the light-sensing cells 130a, 130b, and 130c may be prevented.

Figure 8:
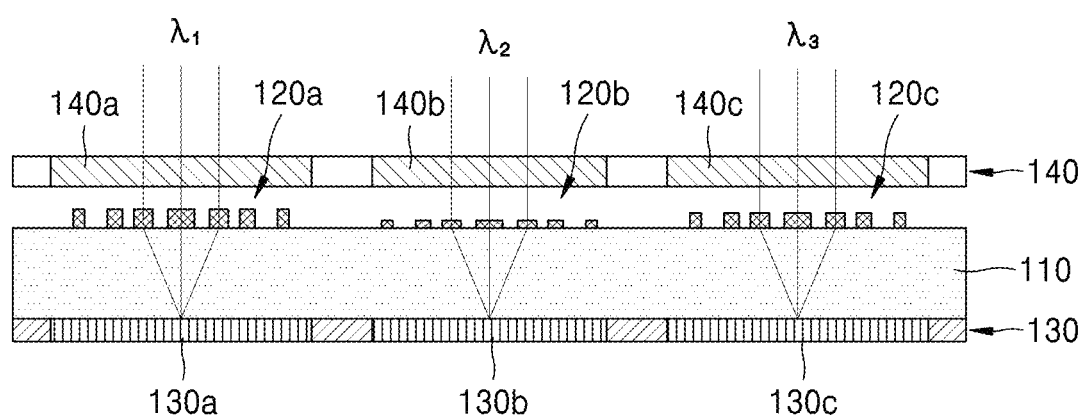
FIG. 8 is a view illustrating an image sensor according to an exemplary embodiment.

FIG. 8 is a view illustrating an image sensor according to an exemplary embodiment.

In FIG. 8, a repeated explanation of the same elements or operations as those in FIG. 1 will not be given.

Referring to FIG. 8, another image sensor according to an exemplary embodiment may include a plurality of light filters 140a, 140b, and 140c, and each light filter in the plurality of light filters 140a, 140b, and 140c is configured to filter wavelength components of pieces of light incident on a respective light-sensing cell of the plurality of light-sensing cells 130a, 130b, and 130c. The plurality of light filters 140a, 140b, and 140c may be included in a single light filter layer 140. However, this is provided herein as an example, and the plurality of light filters 140a, 140b, and 140c may be included in separate light filter layers from one another. The light filters of the plurality of light filters 140a, 140b, and 140c may be prepared in correspondence to a respective light-sensing cell of the plurality of light-sensing cells 130a, 130b, and 130c. For example, a first light filter 140a may filter a wavelength of light incident on the first light-sensing cell 130a. Also, a second light filter 140b may filter a wavelength of light incident on the second light-sensing cell 130b. Also, a third light filter 140c may filter a wavelength of light incident on the third light-sensing cell 130c.

The first light filter 140a may allow only a predetermined wavelength component from incident light to transmit therethrough according to a wavelength selectivity of the first thin-lens 120a. For example, light of the first wavelength $\lambda_1$ from among incident light may transmit through the first light filter 140a, and the first light filter 140a may allow light of the remaining wavelength components to be reflected or absorbed. In the same manner, light of the second wavelength $\lambda_2$ from among incident light may transmit through the second light filter 140b, and the second light filter 140b may allow light of the remaining wavelength components to be reflected or absorbed. Also, light of the third wavelength $\lambda_3$ from among incident light may transmit through the third light filter 140c, and the third light filter 140c may allow light of the remaining wavelength components to be reflected or absorbed.

FIG. 8 shows an example of the light filters 140a, 140b, and 140c formed at locations where light incident on the thin lenses 120a, 120b, and 120c transmit therethrough. However, exemplary embodiments are not limited thereto. For example, the light filters 140a, 140b, and 140c may be formed between the thin lenses 120a, 120b, and 120c and the light-sensing layer 130. In this case, wavelengths of light transmitted through the light filters 140a, 140b, and 140c and the thin lenses 120a, 120b, and 120c may be filtered. In any cases, the light filters 140a, 140b, and 140c may filter wavelength components of light that is incident on the light-sensing cells 130a, 130b, and 130c of the light-sensing layer 130, respectively. Because the light filters 140a, 140b, and 140c filter wavelengths of incident light, a phenomenon of light of a wavelength band beyond the wavelength selectivity of each of the thin lenses 120a, 120b, and 120c (where, the phenomenon is also referred to as "optical crosstalk") may be prevented from being incident on the light-sensing cells 130a, 130b, and 130c. Also, quality of images obtained from the light-sensing cells 130a, 130b, and 130c may improve.

Figure 9:
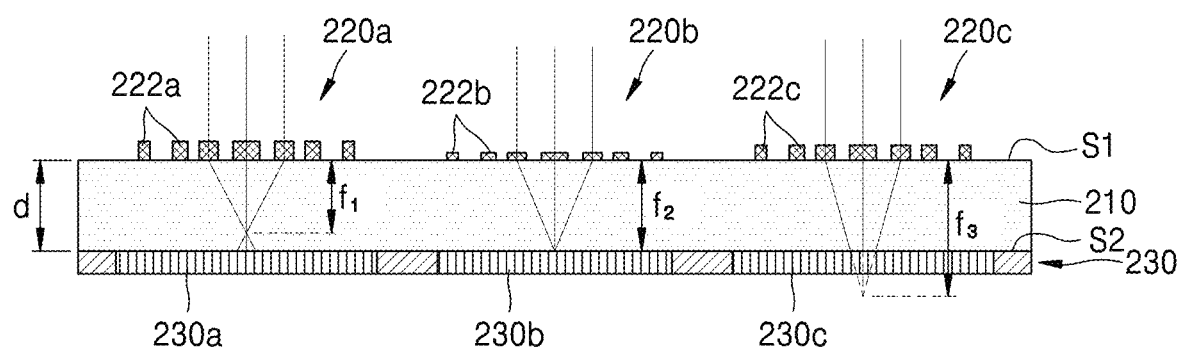
FIG. 9 is a view illustrating an image sensor according to another exemplary embodiment.

FIG. 9 is a view illustrating an image sensor according to another exemplary embodiment.

In FIG. 9, a repeated explanation of the same elements or operations as those in FIGS. 1 through 8 will not be given.

Referring to FIG. 9, the image sensor according to an exemplary embodiment may include a substrate 210, a plurality of thin lenses 220a, 220b, and 220c that are formed on a first surface S1 of the substrate 210 and concentrate pieces of light that are incident on the first surface S1, and a plurality of light-sensing cells 230a, 230b, and 230c that are formed on a second surface S2 facing the first surface S1 of the substrate 210 and generate electrical signals upon sensing light that has transmitted through the plurality of thin lenses 220a, 220b, and 220c.

The substrate 210 may include a transparent material. As used herein, the term "transparent material" denotes a material having a high light transmittance. For example, the substrate 210 may include at least one from among $Si_3N_4$, $SiO_2$, and a polymer such as PMMA or PDMS. Once a path of incident light changes by the thin lenses 220a, 220b, and 220c, the incident light may pass through the substrate 210 and be incident on a light sensing layer 230. The substrate 210, similar to an exemplary embodiment shown in FIG. 7, may include a plurality of sub-substrates.

Figure 10:
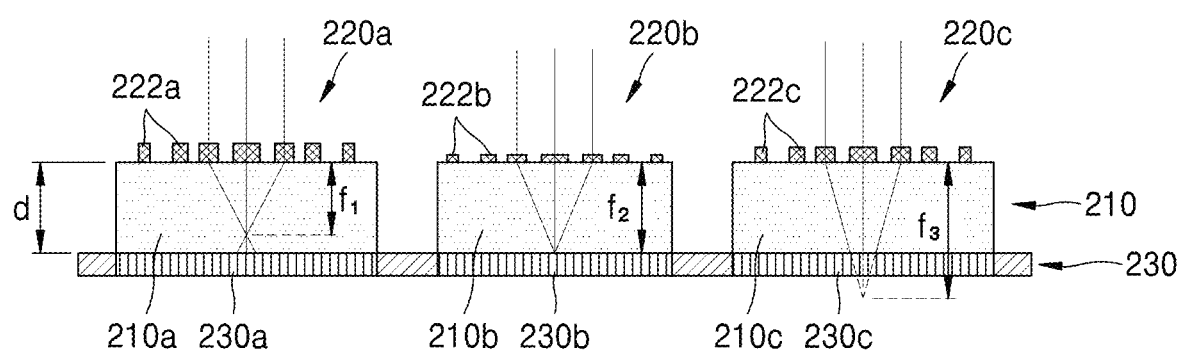
FIG. 10 is a view illustrating an image sensor including a substrate including a plurality of sub-substrates, according to an exemplary embodiment.

FIG. 10 is a view illustrating an example of the substrate 210 including a plurality of sub-substrates 210a, 210b, and 210c, according to an exemplary embodiment.

Referring to FIG. 10, the sub-substrates 210a, 210b, and 210c may be formed in correspondence to a respective thin lens of the plurality of thin lenses 220a, 220b, and 220c and a respective light-sensing cell of the plurality of light-sensing cells 230a, 230b, and 230c. For example, a first thin-lens 220a and a first light-sensing cell 230a may be formed on a first and second surface of a first sub-substrate 210a, respectively. Also, a second thin-lens 220b and a second light-sensing cell 230b may be formed on a first and second surface of a second sub-substrate 210b, respectively. Also, a third thin-lens 220c and a third light-sensing cell 230c may be formed on a first and second surface of a third sub-substrate 210c, respectively. When the substrate 210 is divided into the plurality of sub-substrates 210a, 210b, and 210c, interference between pieces of light that are incident on each of the light-sensing cells 130a, 130b, and 130c may be prevented.

The thin lenses 220a, 220b, and 220c may include a plurality of scatterers 222a, 222b, and 222c. At least two from among the thin lenses 220a, 220b, and 220c may be configured to concentrate pieces of the incident light on the light-sensing cells 230a, 230b, and 230c to have different focal lengths. For example, the first thin-lens 220a may concentrate pieces of the incident light to have a first focal length $f_1$ in a direction toward the first light-sensing cell 230a. Also, the second thin-lens 220b may concentrate pieces of the incident light to have a second focal length $f_2$ in a direction toward the second light-sensing cell 230b. Also, the third thin-lens 220c may concentrate pieces of the incident light to have a third focal length $f_3$ in a direction toward the third light-sensing cell 230c. This is provided herein as an example only, and exemplary embodiments are not limited thereto. For example, the first through third thin lenses 220a, 220b, and 220c do not necessarily have to concentrate pieces of incident light to have focal lengths that are all different from one another, and two from among the first through third thin lenses 220a, 220b, and 220c may concentrate pieces of incident light to have substantially the same focal length.

Descriptions of exemplary embodiments provided herein with reference to FIGS. 2 through 5 may apply to surfaces of the thin lenses 220a, 220b, and 220c. The scatterers 222a, 222b, and 222c included in the thin lenses 220a, 220b, and 220c may have pillar structures. The scatterers 222a, 222b, and 222c may have a shape of a cross-section of the pillar structure that may be from among a circle, an oval, a rectangle, and a square. Also, the scatterers 222a, 222b, and 222c may have a polygonal prism shape or a pillar structure with a cross-section having an "L"-like shape. Shapes of the scatterers 222a, 222b, and 222c may not have symmetricity in a direction. For example, a cross-section of the scatterers 222a, 222b, and 222c may have a shape that is not symmetrical in a horizontal direction as, for example, an oval shape. Also, when cross-sections of the scatterers 222a, 222b, and 222c differ according to its height, the shapes of the scatterers 222a, 222b, and 222c may be asymmetric with respect to the height.

Shapes of the scatterers 222a, 222b, and 222c may vary depending on focal lengths of the thin lenses 220a, 220b, and 220c. For example, scatterers 222a included in the first thin-lens 220a may have a shape appropriate to concentrate pieces of light to have a first focal length $f_1$. In one exemplary embodiment, a cross-sectional shape of the scatterers 222a and a ratio between a width and a height of the scatterers 122a may change. Also, scatterers 222b included in the second thin-lens 220b may have a shape appropriate to concentrate pieces of light to have a second focal length $f_2$. Also, scatterers 222c included in the third thin-lens 220c may have a shape appropriate to concentrate pieces of light to have a third focal length $f_3$. At least two from among the first through third focal lengths $f_1$, $f_2$, and $f_3$ may be different from each other. Also, interval distances among the scatterers 222a, 222b, and 222c and heights of the scatterers 222a, 222b, and 222c may differ according to focal lengths of the thin lenses 220a, 220b, and 220c.

When the focal lengths of the thin lenses 220a, 220b, and 220c change, images that are defocused to different degrees may be formed on the light-sensing cells 230a, 230b, and 230c. Defocusing degrees of the images formed on the light-sensing cells 230a, 230b, and 230c may differ according to the focal lengths of the thin lenses 220a, 220b, and 220c and distances between an object and the thin lenses 220a, 220b, and 220c. Therefore, when a defocusing degree for each position of an image measured by each of the light-sensing cells 230a, 230b, and 230c is compared with those of images measured by light-sensing cells and then extracted, distances between the thin lenses 220a, 220b, and 220c and the object and a 3-dimensional shape may be obtained.

Figure 11:
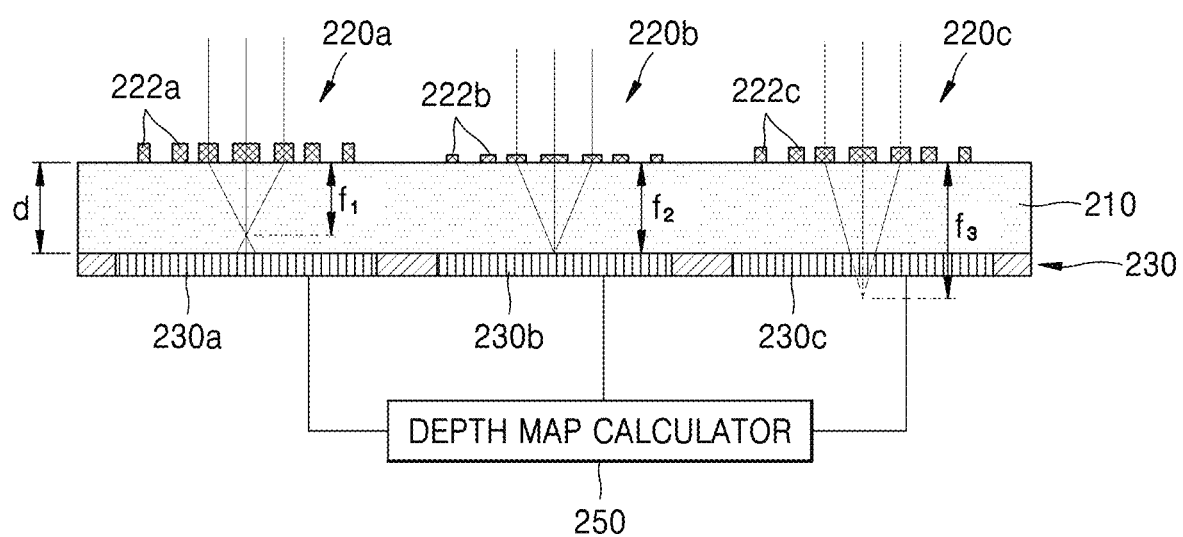
FIG. 11 is a view illustrating an image sensor according to an exemplary embodiment.

FIG. 11 is a view illustrating an image sensor according to an exemplary embodiment.

Referring to FIG. 11, the image sensor may further include a depth map calculator 250 that is configured to calculate depth map information of an image corresponding to incident light. The depth map calculator 250 may receive images measured by the light-sensing cells 230a, 230b, and 230c. Also, the depth map calculator 250 may recognize a relative blur degree for each position of the images measured by one from among the light-sensing cells 230a, 230b, and 230c. Also, the depth map calculator 250 may calculate a defocusing degree for each position of the images measured by one from among the light-sensing cells 230a, 230b, and 230c.

The depth map calculator 250 may calculate depth map information of an image corresponding to the incident light from the defocusing degree measured by each of the light-sensing cells 230a, 230b, and 230c and the focal length of each of the thin lenses 220a, 220b, and 220c. For example, the depth map calculator 250 may calculate a distance from each of a plurality of points on each of objects or a surface of an object included in the image to each of the thin lenses 220a, 220b, and 220c. In this regard, as the depth map calculator 250 calculates the depth map information, the image sensor may obtain a 3-dimensional image of the object.

The thin lenses 220a, 220b, and 220c may each concentrate pieces of light having a predetermined wavelength component. The thin lenses 220a, 220b, and 220c may function as an optical device with respect to a predetermined wavelength band of incident light. Shapes, a shape of arrangement, interval distances, and heights of the scatterers 222a, 222b, and 222c included in the thin lenses 220a, 220b, and 220c may be determined according to wavelength selectivity of the thin lenses 220a, 220b, and 220c.

For example, to output an image with one color, all the thin lenses 220a, 220b, and 220c may have substantially the same wavelength selectivity. The thin lenses 220a, 220b, and 220c may all concentrate light of substantially the same wavelength component. Also, shapes, a shape of arrangement, interval distances, and heights of the scatterers 222a, 222b, and 222c included in the thin lenses 220a, 220b, and 220c may be determined according to focal lengths of the thin lenses 220a, 220b, and 220c. Heights and interval distances of the scatterers 222a, 222b, and 222c may be smaller than a wavelength of light that is concentrated by the thin lenses 220a, 220b, and 220c.

Figure 12:
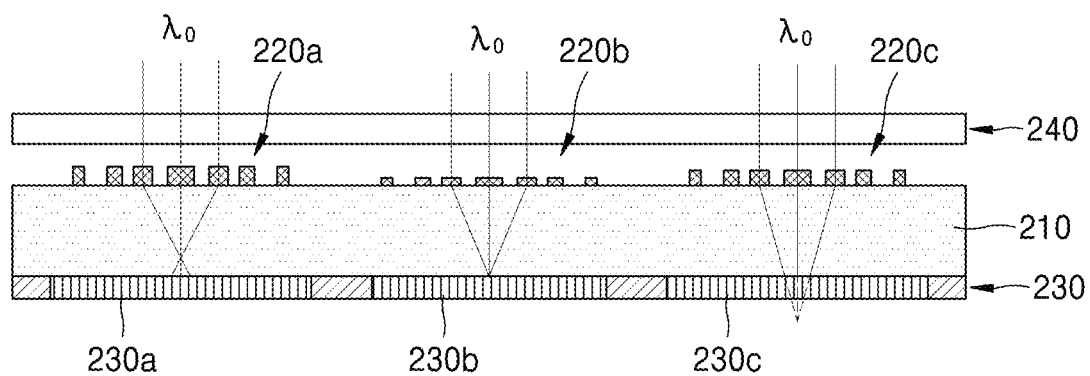
FIG. 12 is a view illustrating an image sensor according to an exemplary embodiment.

FIG. 12 is a view illustrating an image sensor according to an exemplary embodiment.

Referring to FIG. 12, the image sensor may include a light filter layer 240 that filters wavelength components of light incident on each of the light-sensing cells 230a, 230b, and 230c. Although the light filter layer 240 illustrated in FIG. 12 is prepared at a position where the light incident on the light-sensing cells 230a, 230b, and 230c travels, exemplary embodiments are not limited thereto. In one or more exemplary embodiments, the light filter layer 240 may be positioned between the thin lenses 220a, 220b, and 220c and the light sensing layer 230 including the light-sensing cells 230a, 230b, and 230c. The light filter layer 240 may allow a predetermined wavelength $\lambda_0$ component among the incident light to transmit therethrough and may reflect or absorb the remaining wavelength components. Because the light filter layer 240 filters the wavelengths of the incident light, noise light of undesired wavelengths may be prevented from being incident on the light-sensing cells 230a, 230b, and 230c. Also, quality of images obtained from the light-sensing cells 230a, 230b, and 230c may improve.

The thin lenses 220a, 220b, and 220c may each concentrate pieces of light having different wavelengths to have different focal lengths. For example, the first thin-lens 220a may concentrate light having a first wavelength $\lambda_1$ to have a first focal length $f_1$. The scatterers 222a included in the first thin-lens 220a may have a shape of arrangement and interval distances appropriate to concentrate pieces of light having the first wavelength $\lambda_1$ to have the first focal length $f_1$. Also, the second thin-lens 220b may concentrate light having a second wavelength $\lambda_2$ to have a second focal length $f_2$. The scatterers 222b included in the second thin-lens 220b may have a shape of arrangement and interval distances appropriate to concentrate pieces of light having the second wavelength $\lambda_2$ to have the second focal length $f_2$. Also, the third thin-lens 220c may concentrate light having a third wavelength $\lambda_3$ to have a third focal length $f_3$. The scatterers 222c included in the third thin-lens 220c may have a shape of arrangement and interval distances appropriate to concentrate pieces of light having the third wavelength $\lambda_3$ to have the third focal length $f_3$.

Heights and interval distances of the scatterers 222a, 222b, and 222c included in the thin lenses 220a, 220b, and 220c may vary according to wavelength selectivities of 220a, 220b, and 220c, respectively. For example, interval distances between the scatterers 222a and heights of the scatterers 222a in the first thin-lens 220a may be smaller than the first wavelength $\lambda_1$. Also, interval distances between the scatterers 222b and heights of the scatterers 222b in the second thin-lens 220b may be smaller than the second wavelength $\lambda_2$. Also, interval distances between the scatterers 222c and heights of the scatterers 222c in the third thin-lens 220c may be smaller than the third wavelength $\lambda_3$.

Figure 13:
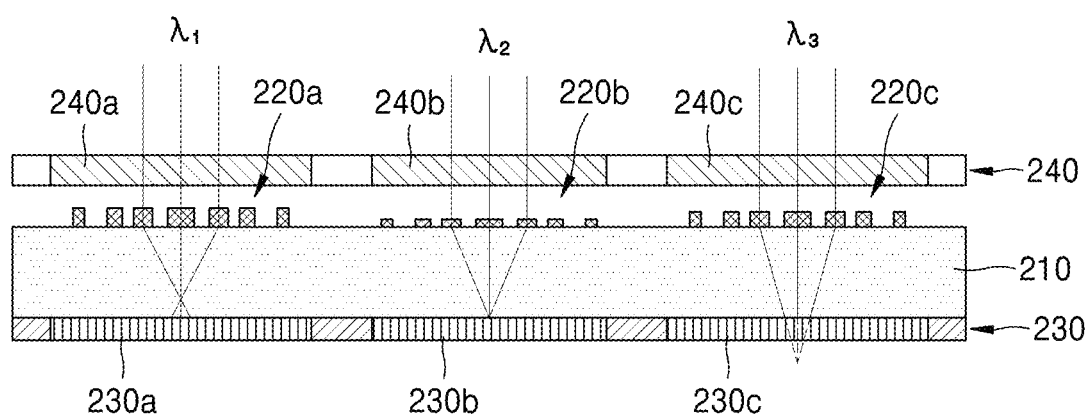
FIG. 13 is a view illustrating an image sensor according to an exemplary embodiment.

FIG. 13 is a view illustrating an image sensor according to an exemplary embodiment.

Referring to FIG. 13, the image sensor may include a light filter layer 240 configured to filter wavelength components of light incident on each of the light-sensing cells 230a, 230b, and 230c. The light filter layer 240 may include a plurality of light filters 240a, 240b, and 240c. The light filters 240a, 240b, and 240c may be applied in correspondence to the light-sensing cells 230a, 230b, and 230c. For example, a first light filter 240a may be configured to filter a wavelength of light incident on a first light-sensing cell 230a. Also, a second light filter 240b may be configured to filter a wavelength of light incident on a second light-sensing cell 230b. Also, a third light filter 240c may be configured to filter a wavelength of light incident on a third light-sensing cell 230c.

The first light filter 240a may transmit a predetermined wavelength component among incident light according to a wavelength selectivity of the first thin-lens 220a. For example, the first light filter 240a may allow light having a first wavelength $\lambda_1$ to transmit therethrough and reflect or absorb light of the remaining wavelength components. In the same manner, the second light filter 240b may allow light having a second wavelength $\lambda_2$ to transmit therethrough and reflect or absorb light of the remaining wavelength components. Also, the third light filter 240c may allow light having a third wavelength $\lambda_3$ to transmit therethrough and reflect or absorb light of the remaining wavelength components. Because the light filters 240a, 240b, and 240c filter wavelengths of incident light, noise light of undesired wavelengths may be prevented from being incident on the light-sensing cells 230a, 230b, and 230c. Also, quality of images obtained from the light-sensing cells 230a, 230b, and 230c may improve. Further, the light-sensing cells 230a, 230b, and 230c each generate images in different colors, and thus a multi-color image may be produced by synthesizing the images.

As described above, according to the one or more of the above exemplary embodiments, an image sensor has been described with reference to FIGS. 1 through 13. The image sensor may concentrate pieces of incident light by using a plurality of thin lenses. In this regard, a size of the image sensor may be reduced. Also, at least one from among a plurality of operation characteristics of the thin lenses may be controlled by changing at least one from among shapes, a shape of arrangement, interval distances, and sizes of the thin lenses. Therefore, the image sensor may be easily manufactured. In addition, a 3-dimensional image, a multi-color image, and depth map information of an object may be easily obtained from imaged generated from a plurality of light-sensing cells.

Figure 14:
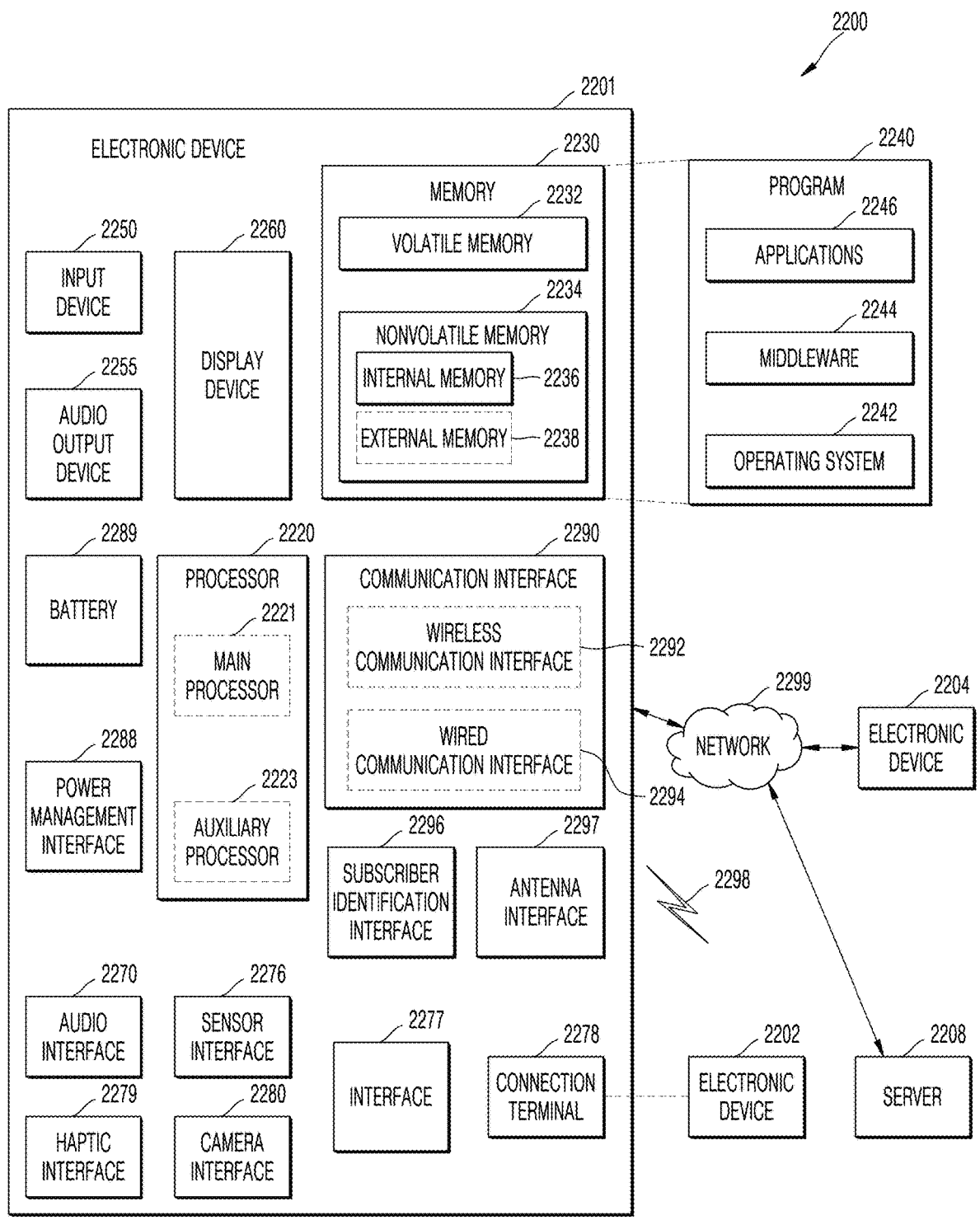
FIG. 14 illustrates a block diagram of an electronic device in a network environment according to an example embodiment.

FIG. 14 is a block diagram illustrating an example of an electronic device 2201 within a network environment 2200. Referring to FIG. 14, in the network environment 2200, the electronic device 2201 may communicate with another electronic device 2202 through a first network 2298 (near-field wireless communication network, etc.), or may communicate with another electronic device 2204 and/or a server 2208 through a second network 2299 (a telecommunications network, etc.). The electronic device 2201 may communicate with the electronic device 2204 through the server 2208. The electronic device 2201 may include a processor 2220, a memory 2230, an input device 2250, an audio output device 2255, a display device 2260, an audio device 2270, a sensor 2276, an interface 2277, a haptic device 2279, a camera 2280, a power management device 2288, a battery 2289, a communication interface 2290, a subscriber identification device 2296, and/or an antenna 2297. In the electronic device 2201, some (the display device 2260, etc.) of these components may be omitted, or other components may be added. Some of these components may be implemented in one integrated circuit. For example, the sensor 2276 (a fingerprint sensor, an iris sensor, an illuminance sensor, etc.) may be implemented by being embedded in the display device 2260 (a display, etc.).

The processor 2220 may execute software (a program 2240, etc.) to control one or more other components (hardware or software components, etc.) of the electronic device 2201 connected to the processor 2220, and may perform a variety of data processing or operations. As a portion of the data processing or operations, the processor 2220 may load instructions and/or data received from other components (the sensor 2276, the communication interface 2290, etc.) into a volatile memory 2232, may process instructions and/or data stored in the volatile memory 2232, and may store result data in a nonvolatile memory 2234. The processor 2220 may include a main processor 2221 (a central processing unit, an application processor, etc.) and an auxiliary processor 2223 (a graphics processing unit, an image signal processor, a sensor hub processor, a communication processor, etc.) that may be operated independently or together. The auxiliary processor 2223 uses less power than the main processor 2221 and may perform specialized functions.

The auxiliary processor 2223 may control functions and/or states related to some (the display device 2260, the sensor 2276, the communication interface 2290, etc.) of components of the electronic device 2201 on behalf of the main processor 2221 while the main processor 2221 is in an active (e.g., sleep) state or with the main processor 2221 while the main processor 2221 is in an inactive (e.g., application execution) state. The auxiliary processor 2223 (an image signal processor, a communication processor, etc.) may be implemented as a portion of other functionally relevant components (the camera 2280, the communication interface 2290, etc.).

The memory 2230 may store a variety of data required by components (the processor 2220, the sensor 2276, etc.) of the electronic device 2201. The data may include, for example, software (the program 2240, etc.) and input data and/or output data for commands related thereto. The memory 2230 may include the volatile memory 2232 and/or the nonvolatile memory 2234.

The program 2240 may be stored as software in the memory 2230, and may include an operating system 2242, middleware 2244, and/or applications 2246.

The input device 2250 may receive commands and/or data to be used for the components (the processor 2220, etc.) of the electronic device 2201 from the outside (a user, etc.) of the electronic device 2201. The input device 2250 may include a microphone, mouse, keyboard, and/or digital pen (a stylus pen, etc.).

The audio output device 2255 may output an audio signal to the outside of the electronic device 2201. The audio output device 2255 may include a speaker and/or a receiver. The speaker may be used for general purposes such as multimedia playback or recording playback, and the receiver may be used to receive incoming calls. The receiver may be combined as a portion of the speaker or may be implemented as a separate device.

The display device 2260 may visually provide information to the outside of the electronic device 2201. The display device 2260 may include a display, a hologram device, or a projector, and a control circuit for controlling the devices. The display device 2260 may include a touch circuitry set to sense a touch, and/or a sensor circuit (a pressure sensor, etc.) configured to measure the intensity of force generated by the touch.

The audio device 2270 may convert sound into an electrical signal, or vice versa. The audio device 2270 may obtain sound through the input device 2250, or may output sound through the audio output device 2255 and/or speakers and/or headphones of another electronic device (an electronic device 2102, etc.) directly or wirelessly connected to the electronic device 2201.

The sensor 2276 may detect an operating state (power, temperature, etc.) of the electronic device 2201 or an external environmental state (user status, etc.), and may generate an electrical signal and/or a data value corresponding to the detected state. The sensor 2276 may include a gesture sensor, a gyro sensor, a barometric sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 2277 may support one or more designated protocols, which may be used to directly or wirelessly connect the electronic device 2201 with other electronic devices (the electronic device 2102, etc.). The interface 2277 may include a high definition multimedia interface (HDMI), a universal serial bus (USB) interface, a secure digital (SD) card interface, and/or an audio interface.

A connection terminal 2278 may include a connector through which the electronic device 2201 may be physically connected to other electronic devices (the electronic device 2102, etc.). The connection terminal 2278 may include an HDMI connector, a USB connector, an SD card connector, and/or an audio connector (a headphone connector, etc.).

The haptic device 2279 may convert electrical signals into a mechanical stimulus (vibration, movement, etc.) or an electrical stimulus that the user may perceive through tactile or motor sensations. The haptic device 2279 may include a motor, a piezoelectric element, and/or an electrical stimulation device.

The camera 2280 may capture a still image and a moving image. The camera 2280 may include a lens assembly including one or more lenses, image sensors, image signal processors, and/or flashes. The lens assembly included in the camera 2280 may collect light emitted from an object to be image captured.

The power management device 2288 may manage power supplied to the electronic device 2201. The power management device 388 may be implemented as a portion of a power management integrated circuit PMIC.

The battery 2289 may supply power to components of the electronic device 2201. The battery 2289 may include a non-rechargeable primary battery, a rechargeable secondary battery, and/or a fuel cell.

The communication interface 2290 may support establishment of a direct (wired) communication channel and/or a wireless communication channel between the electronic device 2201 and other electronic devices (the electronic device 2102, an electronic device 2104, a server 2108, etc.), and communication through the established communication channel. The communication interface 2290 operates independently of the processor 2220 (an application processor, etc.) and may include one or more communication processors supporting direct communication and/or wireless communication. The communication interface 2290 may include a wireless communication interface 2292 (a cellular communication interface, a short-range wireless communication interface, a global navigation satellite system (GNSS), etc.) and/or a wired communication interface 2294 (a local area network (LAN) communication interface, a power line communication interface, etc.). The corresponding communication interface among these communication interfaces may communicate with other electronic devices through the first network 2298 (a local area network such as Bluetooth, WiFi Direct, or Infrared Data Association (IrDA)) or the second network 2299 (a telecommunication network such as a cellular network, the Internet, or computer networks (LAN, WAN, etc.)). These various types of communication interfaces may be integrated into a single component (a single chip, etc.) or may be implemented as a plurality of separate components (multiple chips). The wireless communication interface 2292 may identify and authenticate the electronic device 2201 within a communication network such as the first network 2298 and/or the second network 2299 by using subscriber information (an international mobile subscriber identifier (IMSI), etc.) stored in the subscriber identity module 2296.

The antenna 2297 may transmit and/or receive signals and/or power to and/or from the outside (other electronic devices, etc.). An antenna may include a radiator made of a conductive pattern formed on a substrate (PCB, etc.). The antenna 2297 may include one or more antennas. When a plurality of antenna are included, the communication interface 2290 may select an antenna suitable fora communication method used in a communication network, such as the first network 2298 and/or the second network 2299, among the plurality of antennas. Signals and/or power may be transmitted or received between the communication interface 2290 and other electronic devices through the selected antenna. Other components (RFIC, etc.) besides the antenna may be included as a portion of the antenna 2297.

Some of the components may be connected to each other and exchange signals (command, data, etc.) through a communication method between peripheral devices (a bus, general purpose input and output (GPIO), a serial peripheral interface (SPI), a mobile industry processor interface (MIPI), etc.).

Commands or data may be transmitted or received between the electronic device 2201 and the external electronic device 104 through the server 2108 connected to the second network 2299. The other electronic devices 2202 and 2204 may be the same as or different from the electronic device 2201. All or some of the operations executed in the electronic device 2201 may be executed in one or more of the other electronic devices 2202, 2204, and 2208. For example, when the electronic device 2201 needs to perform certain functions or services, the electronic device 2201 may request one or more other electronic devices to perform some or all of the functions or services instead of directly executing the functions or services. One or more other electronic devices that have received the request may execute an additional function or service related to the request, and may transfer a result of the execution to the electronic device 2201. To this end, cloud computing, distributed computing, and/or client-server computing technologies may be used.

Figure 15:
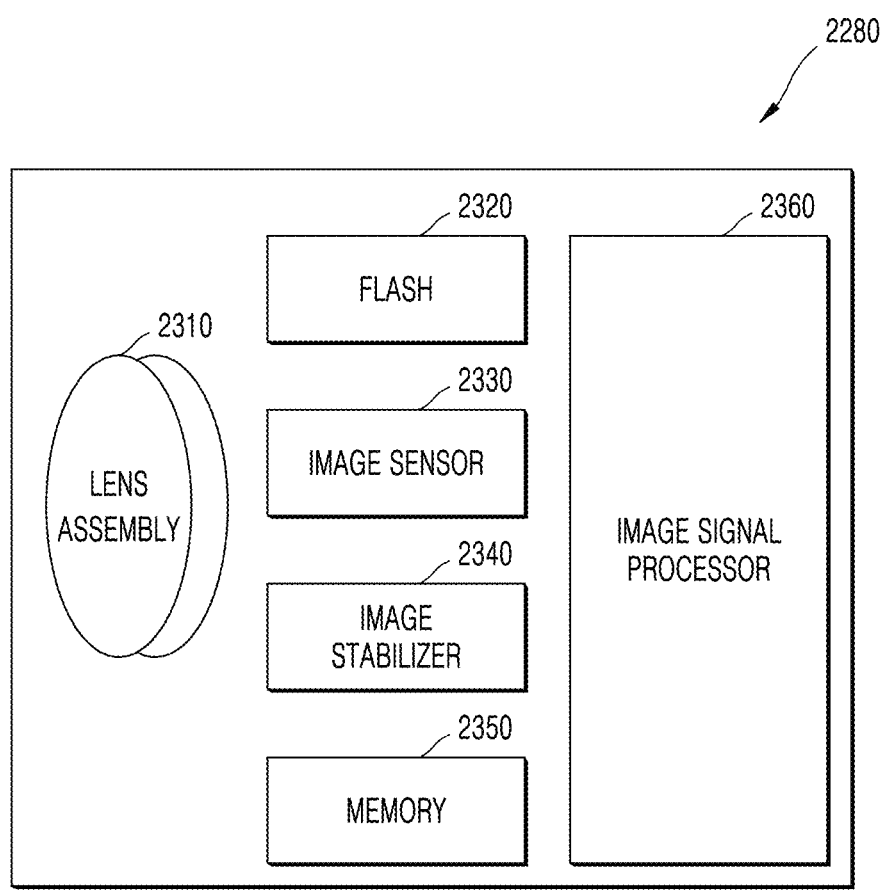
FIG. 15 is a detailed block diagram of a camera of FIG. 14.

FIG. 15 is a block diagram illustrating the camera 2280 of FIG. 14. Referring to FIG. 15, the camera 2280 may include a lens assembly 2310, a flash 2320, an image sensor 2330, an image stabilizer 2340, a memory 2350 (a buffer memory, etc.), and/or an image signal processor 2360. The lens assembly 2310 may collect light emitted from an object to be image captured. The camera 2280 may include a plurality of lens assemblies 2310, and in this case, may be a dual camera, a 360 degree camera, or a spherical camera. Some of the plurality of lens assemblies 2310 may have the same lens properties (angle of view, focal length, autofocus, F Number, optical zoom, etc.) or different lens properties. The lens assembly 2310 may include a wide-angle lens or a telephoto lens.

The flash 2320 may emit light used to enhance light emitted or reflected from an object. The flash 2320 may include one or more light-emitting diodes (red-green-blue (RGB) LED, white LED, infrared LED, ultraviolet LED, etc.), and/or a xenon lamp. The image sensor 2330 may be any one of the image sensors described with reference to FIGS. 1 to 13, and may obtain an image corresponding to the object by converting light emitted or reflected from the object and transferred through the lens assembly 2310 into an electrical signal. The image sensor 2330 may include one or a plurality of sensors selected from image sensors having different attributes, such as an RGB sensor, a black and white (BW) sensor, an IR sensor, or a UV sensor. Each of the sensors included in the image sensor 2330 may be implemented as a charged coupled device (CCD) sensor and/or a complementary metal oxide semiconductor (CMOS) sensor.

The image stabilizer 2340 may move one or a plurality of lenses or the image sensor 2330 included in the lens assembly 2310 in a specific direction in response to movement of the camera 2280 or an electronic device 2301 including the same, or may control an operating characteristic of the image sensor 2330 (adjustment of read-out timing, etc.) such that a negative effect due to movement is compensated for. The image stabilizer 2340 may detect movement of the camera 2280 or the electronic device 2301 by using a gyro sensor or an acceleration sensor arranged inside or outside the camera 2280. The image stabilizer 2340 may be implemented optically.

In the memory 2350, some or all of the data obtained through the image sensor 2330 may be stored for the next image processing operation. For example, when a plurality of images are obtained at high speed, the obtained original data (Bayer-patterned data, high-resolution data, etc.) may be stored in the memory 2350 and only a low-resolution image is displayed, and then the original data of a selected image (user selection, etc.) may be transferred to the image signal processor 2360. The memory 2350 may be integrated into the memory 2230 of the electronic device 2201 or may be configured as a separate memory that is independently operated.

The image signal processor 2360 may perform one or more image processes on an image obtained through the image sensor 2330 or image data stored in the memory 2350. The one or more image processes may include depth map generation, three-dimensional modeling, panorama generation, feature point extraction, image synthesis, and/or image compensation (noise reduction, resolution adjustment, brightness adjustment, blurring, sharpening, softening, etc.). The image signal processor 2360 may control (exposure time control, or read-out timing control, etc.) components (the image sensor 2330, etc.) included in the camera 2280. An image processed by the image signal processor 2360 may be stored again in the memory 2350 for further processing or may be provided to external components (the memory 2230, the display device 2260, the electronic device 2202, the electronic device 2204, the server 2208, etc.) of the camera 2280. The image signal processor 2360 may be integrated into the processor 2220 or may be configured as a separate processor that operates independently of the processor 2220. When the image signal processor 2360 is configured as a separate processor from the processor 2220, an image processed by the image signal processor 2360 may be displayed through the display device 2260 after further image processing by the processor 2220.

The electronic device 2201 may include a plurality of cameras 2280 having respective attributes or functions. In this case, one of the plurality of cameras 2280 may be a wide-angle camera, and the other may be a telephoto camera. Similarly, one of the plurality of cameras 2280 may be a front camera, and the other may be a rear camera.

An electronic device according to the embodiments may include smart phones, tablet personal computers (PCs), mobile phones, video telephones, E-book readers, desktop PCs, laptop PCs, netbook computers, workstations, personal digital assistants (PDAs), portable multimedia players (PMPs), MP3 players, medical devices, cameras, and/or wearable devices. A wearable device may include accessory-type devices (e.g., watches, rings, bracelets, braces, necklaces, glasses, contact lenses, or a head-mounted device (HMD)), textile or garment-integrated devices (e.g., electronic apparel), body-attachment devices (e.g., a skin pad or tattoos), and/or implantable circuits. A wearable device may include augmented reality glasses or virtual reality glasses. In some embodiments, the electronic device may include televisions (TVs), digital video disk (DVD) players, audio players, refrigerators, air conditioners, vacuum cleaners, ovens, microwave ovens, washing machines, air purifiers, set-top boxes, home automation control panels, security control panels, media boxes (e.g., Samsung HomeSync™, Apple TV™, or Google TV™), game consoles (e.g., Xbox™, PlayStation™), electronic dictionaries, electronic keys, camcorders, and/or electronic photo frames.

The electronic device may include various type smart device, for example, smart phone, smart refrigerator, vehicle, automatic vehicle, robot, The electronic device may also include various medical devices (e.g., various portable medical measuring instruments (such as a blood glucose meter, a heart rate meter, a blood pressure meter, or a body temperature meter), magnetic resonance angiography (MRA), magnetic resonance imaging (MRI), computed tomography (CT), cameras, or ultrasound devices), navigation devices, a global navigation satellite system (GNSS), an event data recorder (EDR), a flight data recorder (FDR), automotive infotainment devices, marine electronic devices (e.g., marine navigation device, gyro compass, etc.), avionics, security devices, car head units, industrial or household robots, drones, automatic teller machines (ATMs) at financial institutions, point of sale (POS) of stores, and/or Internet of Things (IoT) devices (e.g., light bulbs, various sensors, sprinkler devices, fire alarms, thermostats, street lights, toasters, exercise equipment, hot water tanks, heaters, boilers, etc.). Also, the electronic device may include a portion of furniture, smart home appliance (eg., smart refrigerator), a building/structure, or an automobile, an autonomous driving device (eg., autonomous vehicle, drone, robot) an electronic board, an electronic signature receiving device, a projector, and/or any of a variety of metering devices (e.g., water, electricity, gas, or a radio wave measuring instrument). The electronic device may be flexible or may be a combination of two or more of the various devices described above. The term "user" may refer to a person using an electronic device or a device using the electronic device (e.g., an artificial intelligence electronic device). As a typical example of the electronic device, an optical device (such as a camera) may be included, and the following description is based on an embodiment in which a lens assembly is mounted on the optical device.

As mentioned above, although example embodiments have been described in the disclosure, it is apparent to one of ordinary skill in the art that various modifications are possible without departing from the gist of the disclosure. For example, dimensions of the plurality of lenses disclosed in the example embodiments may be appropriately set according to a lens assembly to be actually manufactured, the structure and requirements of an electronic device on which the lens assembly will be mounted, an actual use environment, or the like.

It should be understood that example embodiments described herein should be considered in a descriptive sense only and not for purposes of limitation. Descriptions of features or aspects within each example embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. An image sensor comprising:
    a substrate;
    thin lenses disposed on a first surface of the substrate and configured to concentrate lights incident on the first surface, the thin lenses comprising a first thin lens and a second thin lens; and
    light-sensing cells disposed on a second surface of the substrate, the second surface facing the first surface, and the light-sensing cells being configured to sense lights passing through the thin lenses and generate electrical signals based on the sensed lights, the light-sensing cells including a first light sensing cell and a second light sensing cell,
    wherein each of the thin lenses comprises scatterers, the scatterers including material having a refractive index higher than a refractive index of the substrate,
    wherein the first thin lens comprises first scatterers, shapes and arrangement of the first scatterers being configured to concentrate a first light of first wavelength among incident light on the first light sensing cell,
    wherein the second thin lens comprises second scatterers, shapes and arrangement of the second scatterers being configured to concentrate a second light of second wavelength among incident light on the second light sensing cell, and the second wavelength being different to the first wavelength, and
    wherein a shape of arrangement of the second scatterers being different from a shape of arrangement of the first scatterers.

2. The image sensor of claim 1, wherein the shape of arrangement of the first scatterers are further configured to concentrate the first light of first wavelength with a first focal length, and
    wherein the shape of arrangement of the second scatterers are further configured to concentrate the second light with a second focal length different from the first focal length.

3. The image sensor of claim 2, wherein the thin lenses further comprises:
    third thin lens comprising third scatterers disposed on the first surface of the substrate, a shape of arrangement of the third scatterers being configured to concentrate the first light with the second focal length; and
    a fourth thin lens comprising fourth scatterers disposed on the first surface of the substrate, a shape of arrangement of the fourth scatters being configured to concentrate the second light of second wavelength with the first focal length, among lights incident on the first surface.

4. The image sensor of claim 3, wherein the substrate includes plurality of sub-substrate and the first thin lens, the second thin lens, the third thin lens and the fourth thin lens are respectively disposed on a first surface of the each of the sub-substrates, and
    wherein the light-sensing cells are respectively disposed on a second surface of each of the sub-substrates.

5. The image sensor of claim 3, wherein each of the first scatterers, second scatterers, third scatterers and the fourth scatterers includes material having a refractive index higher than a refractive index of the substrate.

6. The image sensor of claim 3, wherein each of the first scatterers, second scatterers, third scatterers and the fourth scatterers has a pillar structure.

7. The image sensor of claim 3, wherein an interval distance between two adjacent first scatterers and an interval distance between two adjacent third scatterers is less than the first wavelength.

8. The image sensor of claim 7, wherein a height of the first scatterers and the third scatterers is less than the first wavelength.

9. The image sensor of claim 3, wherein an interval distance between two adjacent second scatterers and an interval distance between two adjacent fourth scatterers is less than the second wavelength.

10. The image sensor of claim 9, wherein a height of the second scatterers and the fourth scatterers is less than the second wavelength.

11. The image sensor of claim 3, wherein the first scatterers, the second scatterers, the third scatterers and the fourth scatterers comprise at least one from among silicon, gallium phosphide, SiC, SiN, and TiO2.

12. The image sensor of claim 3, wherein the first scatterers and the third scatterers are different in at least one of shape or arrangement thereof.

13. The image sensor of claim 3, wherein the first scatterers and the fourth scatterers are different in at least one of shape or arrangement thereof.

14. The image sensor of claim 3, wherein the second scatterers and the fourth scatterers are different in at least one of shape or arrangement thereof.

15. The image sensor of claim 3, wherein the second scatterers and the third scatterers are different in at least one of shape or arrangement thereof.

16. The image sensor of claim 1, further comprising light filters, each of the light filters being configured to filter respectively the first light of the first wavelength and the second light of the second wavelength, among incident lights.

17. The image sensor of claim 1, further comprising an image synthesizer configured to generate a multi-color image by synthesizing images of different colors,
 wherein the first wavelength and the second wavelength corresponds to different color from each other.

18. The image sensor of claim 1, further comprising a depth map calculator configured to calculate a defocusing degree of an image that is produced on each of the light-sensing cells, and calculate depth map information about an image that is produced by the incident lights, based on the defocusing degree.

19. A camera module comprising;
 a lens assembly including at least one lens;
 an image sensor of claim 1, configured to detect an image of an object from incident light passing through the lens assembly; and
 an image signal processor configured to perform an image process on an image obtained through the image sensor.

20. An electronic device comprising the camera module of claim 19.

21. The electronic device of claim 20, wherein the electronic device is a smart phone, a mobile phone, a laptop computer, a personal computer, a home appliance, an augmented reality device, a medical device, a robot, a drone or an autonomous vehicle.

* * * * *